United States Patent [19]

Nath et al.

[11] Patent Number: 4,773,944

[45] Date of Patent: * Sep. 27, 1988

[54] LARGE AREA, LOW VOLTAGE, HIGH CURRENT PHOTOVOLTAIC MODULES AND METHOD OF FABRICATING SAME

[75] Inventors: Prem Nath, Rochester; Timothy Laarman, Almont; Craig Vogeli, New Baltimore; Kenneth Whelan, Clawson; Bernard Kelly, Sterling Heights, all of Mich.

[73] Assignee: Energy Conversion Devices, Inc., Troy, Mich.

[*] Notice: The portion of the term of this patent subsequent to Mar. 8, 2005 has been disclaimed.

[21] Appl. No.: 94,357

[22] Filed: Sep. 8, 1987

[51] Int. Cl.$^4$ .................. H01L 31/06; H01L 31/18
[52] U.S. Cl. ..................... 136/249; 136/251; 136/256; 136/258; 437/2; 437/4
[58] Field of Search ......................... 437/2-5; 136/249 TJ, 256, 258 AM, 251

[56] References Cited

U.S. PATENT DOCUMENTS

| 4,443,652 | 4/1984 | Izv et al. | 136/251 |
| 4,451,970 | 6/1984 | Izv et al. | 437/8 |
| 4,590,327 | 5/1986 | Nath et al. | 136/256 |
| 4,729,970 | 3/1988 | Nath et al. | 437/225 |

FOREIGN PATENT DOCUMENTS

| 56-69872 | 6/1981 | Japan | 136/258 AM |
| 58-103178 | 6/1983 | Japan | 136/258 AM |
| 59-46426 | 11/1984 | Japan | 136/258 AM |

Primary Examiner—Aaron Weisstuch
Attorney, Agent, or Firm—Marvin S. Siskind; Richard M. Goldman

[57] ABSTRACT

A large area, high current, low voltage photovoltaic module including a common bottom electrode upon which a means adapted to collect and transport photogenerated current is disposed. By electrically interconnecting a plurality of said large area modules in series, the voltage obtained therefrom can be added so as to obtain any desired voltage output therefrom.

39 Claims, 6 Drawing Sheets

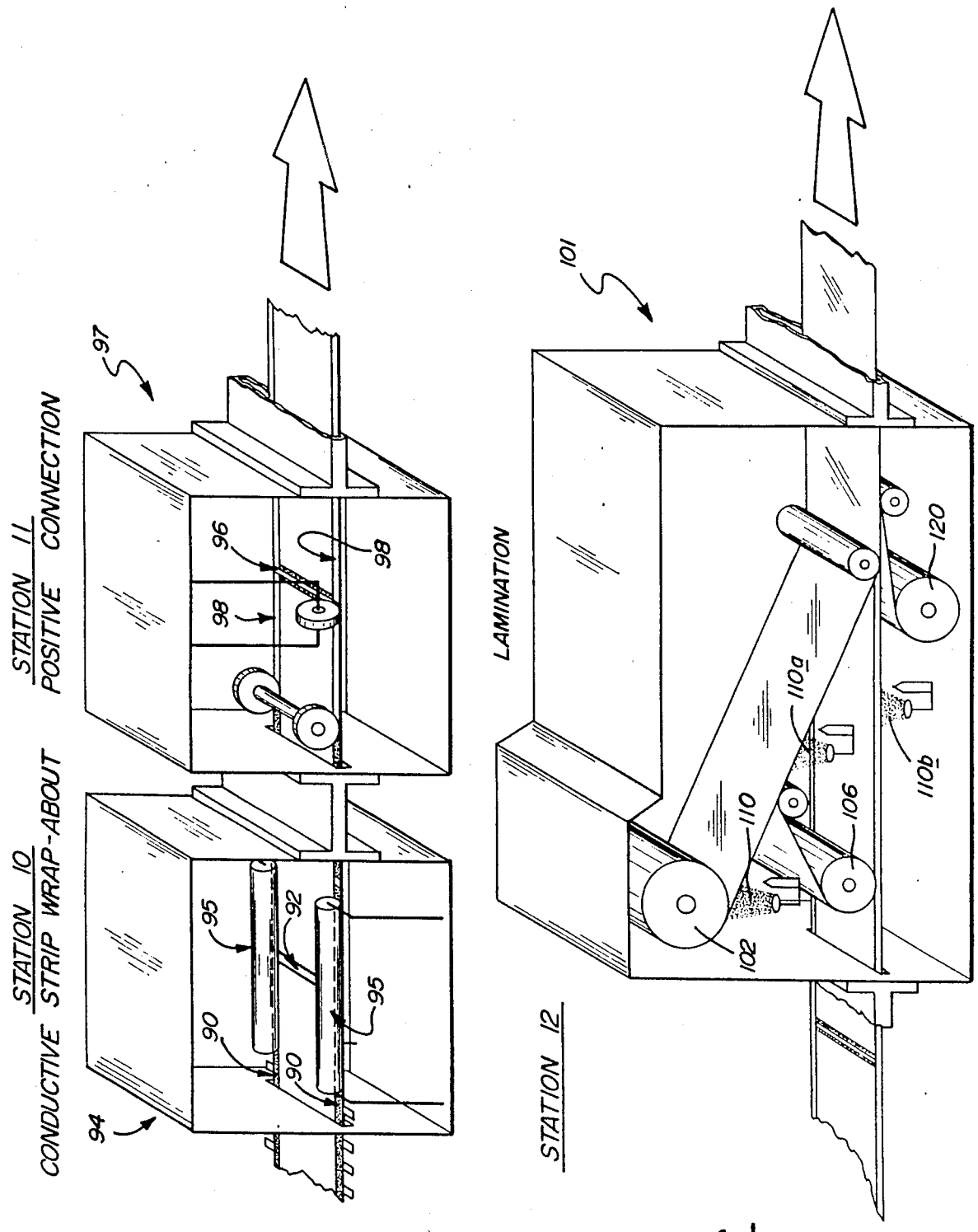

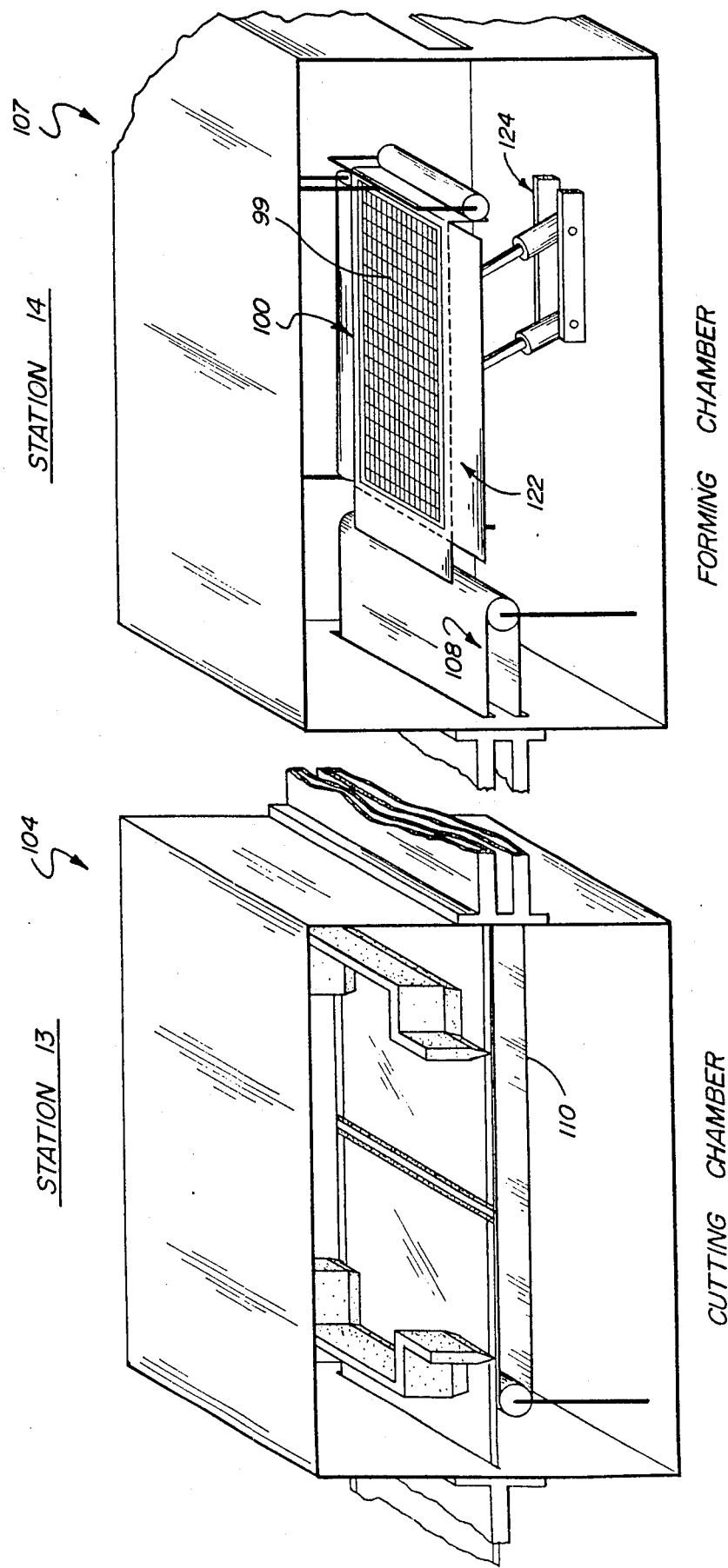

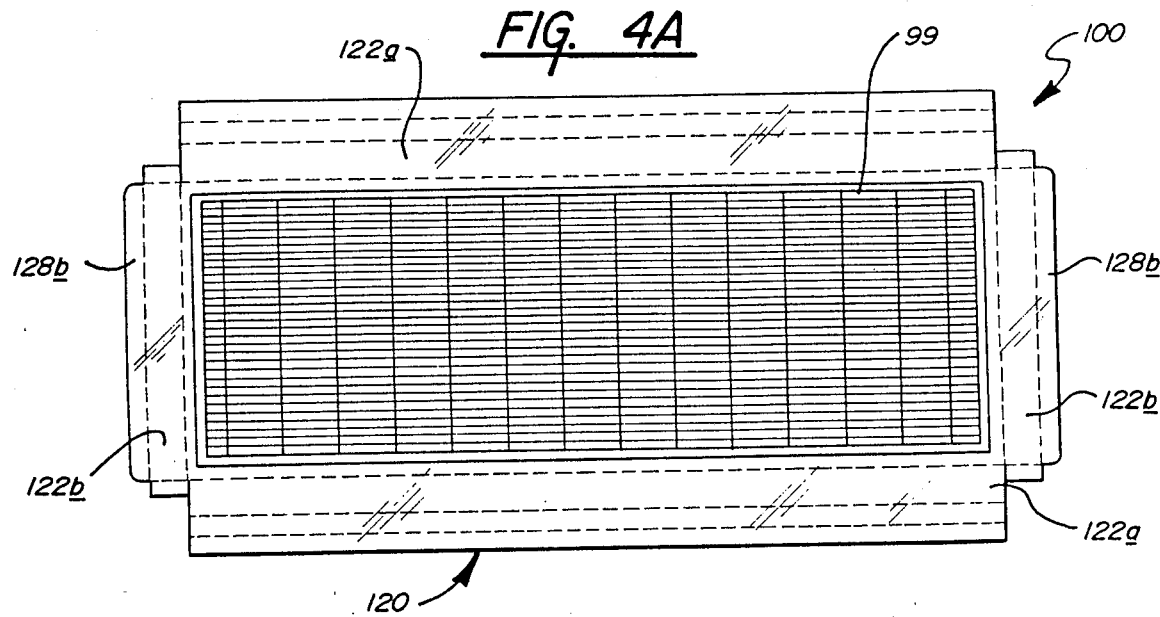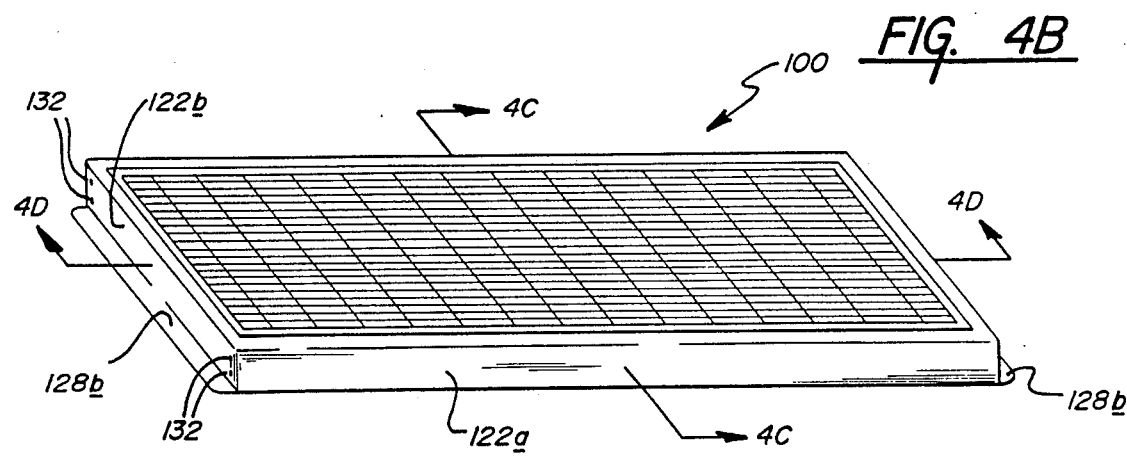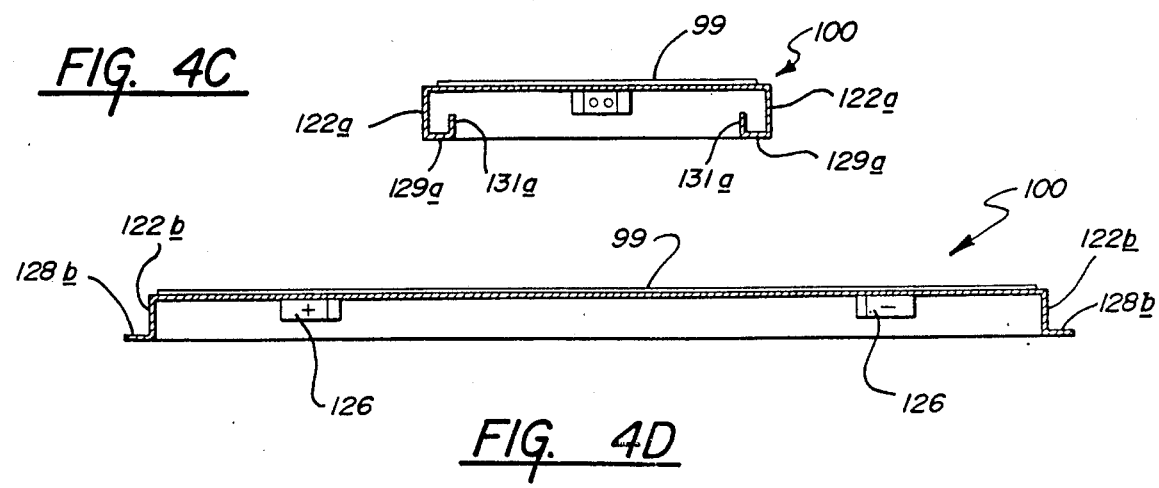

LARGE AREA, LOW VOLTAGE, HIGH CURRENT PHOTOVOLTAIC MODULES AND METHOD OF FABRICATING SAME

FIELD OF THE INVENTION

The instant invention relates generally to large area, thin film, amorphous silicon alloy photovoltaic devices and to methods for fabricating same. More specifically, the instant invention relates to large area, thin film amorphous silicon alloy photovoltaic modules, which large area modules are divided into a plurality of parallel connected small area photovoltaic segments for providing a high current, low voltage output. By electrically interconnecting said large area modules in series, the voltage output therefrom can be added to any desired level.

BACKGROUND OF THE INVENTION

As early as 1978 the assignee of the subject patent application proposed the use of a continuous, roll-to-roll process for the deposition of successive layers of amorphous semiconductor alloy material in order to fabricate n-i-p type photovoltaic devices in mass production. In such a fabrication process, an elongated web of substate material (typically 1000 feet in length, 14 inches wide and perferably formed of stainless steel or some other metallic material), provides both a rigid base upon which the successive layers of semiconductor alloy material can be deposited and the lower electrode of the photovoltaic device. This continuous fabrication process formed the basis of patentable inventions in commonly assigned U.S. Pat. Nos. 4,400,409 for "A Method of Making P-Doped Silicon Films And Devices Made Therefrom" and 4,410,588 for "Continuous Amorphous Solar Cell Deposition And Isolation System And Method". The use of an elongated metallic web of substrate material provides the ability to continuously deposit both the multiple layers of semiconductor alloy material and the upper transparent electrically conductive electrode prior to performing the division of the layers of semiconductor alloy material and electrodes into a plurality of smaller area photovoltaic segments. However, this roll-to-roll process translates into an economic advantage (as compared to batch processing) only if the small area division of the large area photovoltaic cells can be accomplished without patterning or other processing of the lower electrode prior to the initiation of the deposition process. This constraint is important because preliminary processing of the lower electrode would otherwise place the roll-to-roll, continuous web technology in the same economic and technological quagmire as techniques for batch processing thin film photovoltaic cells of relatively small area (such as 1 square foot devices) on glass substrates (wherein the light incident electrode is the first layer deposited and is immediately divided into a multitude of small area segments prior to the deposition of the layers of semiconductor alloy material or bottom electrode).

Therefore, until the assignee of the instant invention developed a substantially 100 percent effective method for eliminating short circuit defects (shunts) from elongated webs of photovoltaic cell material, which method was performed after the depositin of both the multiple layers of semiconductor alloy material and the upper electrode, the thin film photovoltaic industry split into two groups. The first group employed batch process techniques for fabricating large area photovoltaic modules. It was the position of this group that since both the batch processing and the continuous processing of photovoltaic cells requires the initial division of large area photovoltaic cells into small area segments and since batch processing required less expensive capital equipment for the fabrication of those cells, it made sound economic sense to utilize said batch processing techniques in preference to continuous processing techniques.

The second group advocated continuous procesing methodology for the production of large area photovoltaic cells. The rationale employed by the continuous processing group was clear. Since the ultimate goal of the photovoltaic industry was to compete in a cost competitive manner with all other depletable energy resources such as gas, coal and oil, the only way to be cost competitive is to generate photovoltaic power at a consumer cost per peak watt which is less than the cost of conventional power generation per peak watt. Thus, not only was it necessary to constantly increase the photoconversion efficiency of photovoltaic cells, but it was equally important to decrease the cost of fabricating those cells. Due to the fact that technological advances in the quality of discrete layers of semiconductor alloy material from which the photovoltaic cell is fabricated or in the design structure of said photovoltaic cell can be applied, with equal advantage, to both continuous and batch processing technology, it became readily apparent that the major economic advantages must be present in the fabrication technique itself.

It is to the end of reducing production costs so as to have the capability of competing on a cost competative basis with depletable energy resources that the instant invention is directed. More particularly, the subject inventors have formulated a process for fabricating large area photovoltaic cells on an elongated web of substrate material upon a first surface of which the layers of semiconductor alloy material as well as the upper electrode may be continuously and sequentially deposited without interruption for small area subdivision. The subdivision of the large area photovoltaic cells into small area photovoltaic segments is accomplished only after the aforementioned deposition process has been completed; and said subdivision includes the electrical interconnection of those small area photovoltaic segments in parallel to provide a high current, low voltage output. Previously, such continuous processing could not have excluded the possibility of catastrophic failure due to the presence of short circuit, current shunting defect paths (low resistance pathways through the thin film layers of semiconductor alloy material) whereby electric current collected at the electrodes flows through the current shunting path in preference to an external load. However, with the advent by the assignee of the subject patent application of a substantially failsafe short passivation procedure, as outlined in commonly assigned U.S. Pat. No. 4,729,970 issued Mar. 8, 1988, both patent (overt) defects, as well as latent defects, present in the layers of semiconductor alloy material and upper electrode can be isolated and passivated. Therefore, it becomes possible, for the first time, to produce large area photovoltaic modules, which do not require the initial step of patterning the bottom electrode thereof. And since a substantially 100 percent yield from the large area photovoltaic cell is a certainty, such cells can be utilized to provide a low voltage, high current output without fear of catastrophic failure. Further, by electrically interconnecting a plurality of said large area photovoltaic cells in series, the voltage therefrom can be added so as to provide any desired voltage-current combination. Just as important, however, is the ability to utilize the continuous fabrication technique, as specified hereinabove, in a manner which makes full use of the cost saving advantages inherent therein. No intermediate processing steps are required and the inherent economies of continuous cell fabrication can be utilized.

These and other objects and advantages of the instant invention will become apparent from a careful perusal of the drawings, the detailed description of the invention and the claims which follow.

BRIEF SUMMARY OF THE INVENTION

There is disclosed in the subject patent application a method of fabricating large area, high current, low voltage photovoltaic modules. By the use of the term 37 large area", the photovoltaic cells disclosed herein are to be distinguished from single crystal wafers which are limited in size to a maximum dimension of approximately eight (8) inch diameters. In contrast thereto, the photovoltaic cells of the present invention are limited only by the size of the web of substrate material. Thus, thanks to the continuous process described herein, a single cell may measure many hundreds of feet in length by several feet in width. Each photovoltaic module includes a common, conductive lower electrode; a photovoltaic body formed by a plurality of superposed, continuous layers of semiconductor alloy material deposited atop the electrode; and a continuous, transparent, electrically conductive, upper electrode deposited atop the photovoltaic body. The method includes the steps of providing a common, conductive lower electrode; depositing the photovoltaic body on said lower electrode; depositing the transparent conductive upper electrode on said body; providing means adapted to collect and transport photogenerated current to positive and negative module terminals; passivating short circuit defects in the semiconductor alloy material from which said body is fabricated; forming a positive module terminal, said terminal electrically connected to the transparent conductive upper electrode; and forming a negative module terminal, said terminal electrically connected to the common lower electrode. In this manner, the large area photovoltaic body is electrically connected so as to photogenerate high current and low voltage output when exposed to incident radiation. By electrically interconnecting a plurality of the photovoltaic modules in series, any desired voltage output may be obtained therefrom.

The photovoltaic material includes means adapted to collect and transport photogenerated current disposed thereupon. The process includes the further steps of electrically connecting each current collection means to one of the plurality of substantially regularly spaced, electrically conductive strips and electrically connecting the strips to the positive terminal of the module. Then, by affixing at least one elongated bus bar along the longitudinal length of and in electrical communication with said common lower electrode, the bus bar may be electrically connected to the negative terminal of the module. The connection to the positive terminal comprises wrapping the conductive strips about at least one of the edges of the lower electrode and into electrical communication with at least one electrically conductive elongated back strip.

Due to the fact that the photovoltaic device is one large photogenerative cell, any short circuit defects present therein could catastrophically cause the failure of the entire large area module. Therefore, the short circuit defects must be eliminated, which elimination can be effected by bringing the transparent conductive upper electrode into intimate contact with a reagent capable of converting the upper electrode into a higher electrical resistant state and activating the conversion reagent so as to convert said transparent conductive upper electrode into said higher resistant state only adjacent defect regions. In order to accomplish this conversion, the reagent is selected from the group consisting essentially of a Louis acid or the salt of an amphoteric element. The conversion reagent is activated by passing an electrical current through, illuminating or heating the defect regions.

The photovoltaic module may be formed into a substantially planar, rectangular shape described by the dimensions of approximately 13" by 48", the output of which is equal to the open circuit voltage of the device, or about 1.7 to 2.0 volts and about at least 20 amperes.

The large area, high current, low voltage photovoltaic module fabricated by the aforedescribed method is also disclosed herein. The module includes: a common conductive, lower electrode; a photovoltaic body formed by a plurality of superposed, continuous layers of semiconductor alloy material deposited atop said electrode; said photovoltaic body being substantially free of current shunting paths; a continuous transparent, electrically conductive, upper electrode deposited atop said photovoltaic body; means for collecting and transporting photogenerated current to a positive and negative module terminal; a positive module terminal electrically connected to the current collection means of said transparent conductive upper electrode; and a negative module terminal electrically connected to the common lower electrode. By electrically interconnecting a plurality of said photovoltaic modules in series, any desired voltage output may be obtained therefrom.

Two electrically conductive, elongated bus bars, each bus bar welded along one of the opposed longitudinal edges of said lower electrode provide a negative connection to the negative terminal of the module. A plurality of electrically conductive, spacedly disposed strips electrically connect the small area segments of the photovoltaic body. The conductive strips are electrically connected to two electrically, elongated back strips, each back strip insulated from and affixed to one of the bus bars. The spacedly disposed bus bars are electrically interconnected by at least one copper, negative cross-member. The back strips are electrically interconnected by at least one copper, positive cross-member, said back strips being electrically insulated from said lower electrode and affixed to the opposed bus bars by a layer of double sided adhesive.

The large area photovoltaic modules are substantially planar and rectangular in shape, being described by the dimensions of approximately 13" by 48". The voltage output of each of said modules is approximately 1.7 to 2.0 volts and the current output of each of said modules is approximately at least 20 amperes. The voltage output of two of said modules electrically connected in parallel is approximately 2.4 to 4.0 volts and current output of said two modules is approximately at least 20 amperes.

There is also described in the subject patent application a method of forming a large area, high current, low voltage photovoltaic module integral with the lightweight, durable, substantially rigid, readily formable lower laminate. The method comprises the steps of providing a lower, substantially planar, substantially rigid, formable lower laminate; disposing an insulative layer of flowable, organic resin upon said laminate; disposing a large area photovoltaic device upon said flowable organic resin, said device provided with means adapted to collect and transport photogenerated current; disposing an additional layer of flowable organic resin atop said photovoltaic device; disposing a transparent upper laminate atop the additional layer of organic resin; curing the layers of organic resin so as to integrate the photovoltaic device between said upper and lower laminate so as to provide an integrated module; and forming said substantially rigid, readily formable integrated photovoltaic module into a non-planar, preselected configuration.

The method includes the further steps of forming the photovoltaic device on a common substrate, said device including at least two triads of n-i-p type layers of amorphous silicon semiconductor alloy material. The lower laminate is selected from the the group consisting essentially of a metal or a polymeric plastic. A second lower laminate may be provided and a layer of flowable organic resin is disposed atop the second lower laminate with the integrated module disposed atop the layer of organic resin. The layer of organic resin is cured so as to integrate the second lower laminate into the integrated sandwich. The organic resin is cured by subjecting that resin to heat and pressure. After curing the laminate, the laminate is formed into a preselected configuration by use of a bending, stamping or break press forming operation.

By forming a plurality of substantially identically configured, integrated photovoltaic modules and electrically interconnecting those integrated modules in series, the electrical voltage photogenerated by each individual module may be accumulated.

Finally, there is disclosed in the subject patent application a laminated, large area, high current, low voltage, integrated photovoltaic module which includes a lightweight, substantially planar, substantially rigid, readily formable lower laminate; an insulative layer of flowable organic resin deposited atop the lower laminate; a large area, high current, low voltage photovoltaic device; the shunts in said photovoltaic devices being passivated; an additional layer of flowable organic resin deposited atop said photovoltaic device; and a transparent upper laminate disposed atop the additional layer of flowable organic resin.

The material from which the lower laminate is fabricated may be selected from the group consisting essentially of a metal or a polymeric synthetic resin. The photovoltaic device comprises at least two triads of n-i-p type layers of amorphous silicon semiconductor alloy material deposited upon a common substrate. A second lower laminate may be joined by a second layer of flowable organic resin to integrally join said first and second lower laminates. The flowable organic resin is preferably ethyl vinyl acetate and the second lower laminate is preferably TEDLAR. A plurality of integrated modules are electrically interconnected in parallel so as to add the voltage output thereof and provide for any desired combination of voltage, current and power.

BRIEF DESCRIPTION OF THE DRAWINGS

FIGS. 2A-2D are a highly stylized, cut-away, perspective views of the fourteen processing stations of the method of fabricating a low voltage, high current large area photovoltaic module described in the subject patent application;

FIG. 4A is a top plan view of the substantially planar, low voltage, high current, large area photovoltaic module of the subject invention prior to the 3-D forming thereof;

FIG. 4B is a perspective view of the formed, low voltage, high current photovoltaic module of the subject invention;

FIG. 4C is a cross-sectional view taken along line 4C—4C of FIG. 4B and illustrating the shape of the longitudinal skirts of the formed, low voltage, high current photovoltaic module of the subject invention; and FIG. 4D is a cross-sectional view taken along lines 4D—4D of FIG. 4B and illustrating the shape of the transverse skirts of the formed, high current, low voltage photovoltaic module of the subject invention.

DETAILED DESCRIPTION OF THE DRAWINGS

I. The Photovoltaic Cell

Figure 1:
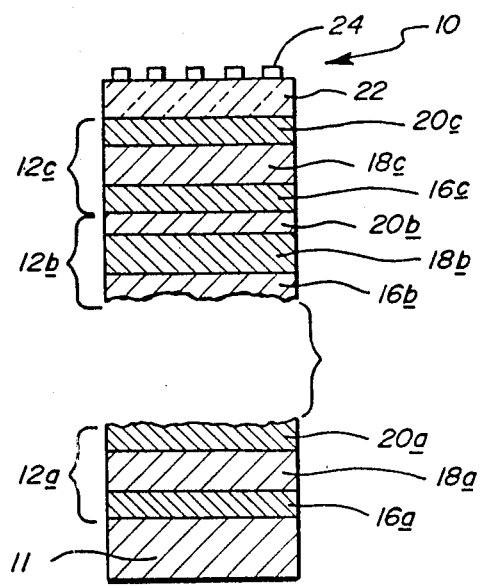
FIG. 1 is a fragmentary cross-sectional view of a tandem photovoltaic device, said device comprising two or more stacked p-i-n type cells, each layer of the cells formed from a semiconductor alloy material.

Referring now to the drawings, where like reference numerals designate like structure, and particularly to FIG. 1, a photovoltaic cell, formed of a plurality of successively deposited n-i-p layers each of which includes, preferably, substantially amorphous thin film semiconductor alloy material, is shown generally by reference numeral 10.

More particularly, FIG. 1 shows an n-i-p photovoltaic device, such as a tandem solar cell, made up of individual n-i-p type cells 12a, 12b and 12c. Below the lower most cell 12a is a substrate 11 which may be formed of a transparent glass or synthetic polymeric member; or it may be formed from a metallic material such as stainless steel, aluminum, tantalum, molybdenum, or chromium; or it may be formed from metallic particles imbedded within an insulator. Although certain applications may require the deposition of an oxide layer and or series of base contacts prior to the deposition of the semiconductor alloy material, the term substrate shall include not only a flexible film, but also any elements added thereto by preliminary processing. Also included within the scope of the present invention are substrates formed of synthetic polymers, and metals coated with a synthetic polymer to which one or more conductive based electrodes are applied. For purposes of the present invention, the preferred substrate material is a relatively thin, flexible stainless steel material, conducive to use in the continuous fabrication process described herein. However, a glass substrate upon which at least one highly conductive electrode is deposited, may also be employed.

Each of the cells 12a, 12b and 12c is preferably fabricated with a thin film semiconductor body containing at least a silicon or silicon: germanium alloy. Each of the semiconductor bodies includes a p type conductivity semiconductor layer 20a, 20b or 20c; a substantially intrinsic semiconductor layer 18a, 18b or 18c; and an n type conductivity semiconductor layer 16a, 16b or 16c. Note that the intrinsic layer may include traces of n type or p type doped material without forfeiting its characteristic neutrality; hence, it may be referred to herein as a "substantially intrinsic layer." As illustrated, cell 12b is an intermediate cell and, as indicated in FIG. 1, additional intermediate cells may be stacked on top of the illustrated cells without departing from the spirit or scope of the present invention. Also, although n-i-p photovoltaic cells are illustrated, this invention may be advantageously practiced with differently configured photovoltaic cells including single or multiple p-i-n cells, Schottky barrier cells, p-n cells, as well as any other semiconductor device having an appropriate top electrode. The term "n-i-p type" as used herein is meant to include any aggregation of n-i-p layers operably disposed to derive a photoactive region for generating charge carriers in response to the absorption of photon energy.

It is to be understood that following the deposition of the layers of semiconductor alloy material, a further deposition process may be either performed in a separate environment or as a part of a continuous process. In this step, a transparent conductive oxide layer 22, preferably formed of a material such as tin oxide, indium oxide, indium tin oxide, zinc oxide, cadmium stannate or combinations thereof, is added atop the p layer 20c of the top most cell 12c, to function as the top electrode of the cell 10. An electrode grid 24 may be added to the device where the cell is of a sufficiently large area or if the conductivity of the transparent conductive oxide layer 22 is insufficient to obtain efficient collection of photogenerated current. The grid 24 is adapted to shorten the carrier path and increase the conduction efficiency. As discussed previously, the respective intrinsic layers 18a, 18b and 18c of cells 12a, 12b and 12c may be and preferably are formed from semiconductor alloy materials having different band gaps. For example, the intrinsic layer 18c of cell 12c may have a band gap of approximately 1.7 eV; the intrinsic layer 18b of cell 12b may have a band gap of approximately 1.5 eV; and the intrinsic layer 18a of cell 12a may have a band gap of approximately 1.3 eV. In this manner, the most efficient use may be made of a large portion of the incident solar spectrum.

II. The Continuous Deposition Process

Turning now to FIGS. 2A–2D, a stylized perspective depiction of the sequential steps in one possible embodiment of a method specifically adapted for the continuous fabrication of large area, high current, low voltage photovoltaic modules is generally illustrated by reference number 26. The fabrication apparatus 26 includes a plurality of isolated, dedicated chambers, each chamber adapted to perform a different function in the process of continuously producing said photovoltaic modules. In the preferred embodiment of this invention, an elongated web of substrate material 11 (such as stainless steel) is utilized so as to continuously pay off from an elongated roll 27 to and through the serially arranged processing chambers. It is in an apparatus of this type that photovoltaic cells similar in operation to cell 10 described with reference to FIG. 1 hereinabove, may be readily manufactured.

As the web of substrate material 11, pays off the substrate roll 27, it enters a first deposition chamber 28a, hereinafter positioned at Station 1A, which chamber is adapted to coat a first surface of the web of substrate material 11 passing therethrough with the first layer 30 of a dual-layered back reflector. In the preferred embodiment of the invention, the deposition of said dual-layered back reflector is actually a two chamber process so that the first layer of back reflective material 30 is deposited in chamber 28a and the second layer of back reflective material 31 is deposited in chamber 28b as the web of substrate material 11 passes therethrough. More particularly, in the chamber 28a there is deposited a thin, approximately 500 angstrom thick layer of highly reflective material 30, such as silver, gold or aluminum (in some applications zinc oxide) by an evaporation process (although other deposition processes may also be employed). Note that the thickness of the reflective layer 30 of back reflective material is dependent only on depositing a sufficient amount of material to prevent agglomeration and obtain full coverage of the surface of the web of substrate material 11. Therefore, the deposition of a layer of silver requires a greater thickness, due to its inherent tendency to agglomerate, vis-a-vis, aluminum or gold. At Station 1B and in the chamber 28b, the second back reflective layer 31, such as zinc oxide, is deposited as by a sputtering process; said second layer being transparent, about 2500 angstroms thick and adapted to (1) provide a buffer between the silver layer 30 and the subsequently deposited layers of semiconductor alloy material as well as (2) optically enhance the total internal reflection of incident solar radiation. The back reflector deposition chambers 28a and 28b may also include (1) one or more heaters 32 for maintaining the desired substrate temperature and (2) one or more spaced ceramic magnets (50) for maintaining the web of substrate material 11 in a generally planar configuration during the deposition process.

After completing the deposition of the dual-layered back reflector material (30 and 31) at Stations 1A and 1B, the web of substrate material 11 enters Station 2 wherein a plurality of interconnected vacuum chambers are specifically adapted to deposit successive layers of substantially amorphous semiconductor alloy material of n-i-p type configuration onto the continuously moving web. The plurality of chambers includes at least two triads of deposition chambers, each triad comprising first deposition chambers 34a and 34b in which a layer of n type conductivity semiconductor alloy material is deposited onto the deposition surface of the web of substrate material 11 as the web 11 passes therethrough; second deposition chambers 36a and 36b in which a layer of intrinsic semiconductor alloy material is deposited atop the n type layer on the deposition surface of the web of substrate material 11 as the web 11 passes therethrough; and third deposition chambers 38a and 38b in which a layer of p type semiconductor alloy material is deposited atop the intrinsic layer of the deposition surface of the web of substrate material 11 as the web 11 passes therethrough.

It should be apparent that although only two triads of deposition chambers have been illustrated, additional triads or additional individual chambers may be added to the apparatus to provide said apparatus with the capability of producing photovoltaic devices having any number of n-i-p type layers of semiconductor alloy material, arranged in any of a number of possible configurations. It should be additionally apparent that although glow discharge is illustrated herein employing cathodes with RF power, other energy supplies such as a.c. power generators, microwave generators and d.c. power generators may be applied without departing from the spirit or the scope of the present invention. It is additionally important to understand that deposition chambers 34a, 34b, 36a, 36b, 38a and 38b are isolated, dedicated deposition chambers, each chamber of which is interconnected by a gas gate (not shown), through which sweep gases and the web of substrate material 11 are allowed to unidirectionally pass without contaminating the enviroment of adjacent chambers.

Chambers 34a and 34b, 36a and 36b, and 38a and 38b are each adapted to successively deposit a single layer of semiconductor alloy material, by glow discharge deposition, onto the web of substrate material 11. To that end, each of the deposition chambers 34a and 34b, 36a and 36b, and 38a and 38b include: a cathode 40, a shield 42 disposed adjacent each of the cathodes 40; a process gas supply conduit 44; a radio frequency generator or other source of electromagnetic power 46; a process gas and plasma evacuation conduit 48; a plurality of transversely extending magnetic elements 50; a plurality of heating elements (not shown); and a gas gate (not shown) operatively interconnecting each of the intrinsic deposition chambers to each of the adjacent dopant chambers. Given the patents, assigned to the assignee of the subject invention, described hereinabove, the actual method for the deposition of semiconductor alloy material upon a web of substrate material should be well known to one skilled in the art and thus need not be elaborated upon further. Note that the elements of deposition have only been given reference numerals in chamber 38b, but that those reference numerals apply to each deposition chamber of the triads.

After exiting from the plurality of chambers dedicated to the deposition of amorphous silicon semiconductor alloy material, the web of substrate material 11 (upon which the dual-layered back reflector material (30 and 31) and successive layers of n-i-p type amorphous silicon semiconductor alloy material have been deposited) enters Stations 3A and 3B wherein chambers 52a and 52b are dedicated to the deposition of a layer of transparent conductive oxide (TCO) material, which TCO material serves as the upper electrode of the photovoltaic cell 10. This dual chamber assembly 52a and 52b is specifically adapted to deposit said transparent conductive oxide material in a two step process. The first deposition sub-chamber 52a is adapted to deposit a thin (approximately 50 angstrom thick) protective layer 54a of, for instance, indium tin oxide upon the previously deposited layers of silicon alloy material as the web of substate material 11 passes therethrough. This protective station 52a may be an evaporation station, a plasma glow discharge deposition station, chemical evaporation deposition station, or a low energy sputtering station. The first deposition chamber 52a may also include several banks of substrate heaters (not shown) adapted to maintain the web of substrate material 11 at an elevated temperature to facilitate the deposition thereonto. This process is well know to those ordinarily skilled in the art and has been fully disclosed in commonly assigned U.S. Pat. No. 4,728,406, issued Mar. 1, 1988, the disclosure of which is incorporated herein by reference.

The second deposition sub-chamber 52b of Station 3B is adapted to deposit the remainder of the layer 54b of transparent conductive oxide material by a more energetic process than the evaporation process of Station 3A. This is possible because the unprotected layers of amorphous silicon semiconductor alloy material which would be seriously damaged by the energetic nature of this more energetic method has been protected by the previously deposited thin film protective layer. The transparent conductive oxide material typically employed in the process described herein with respect to deposition Stations 3A and 3B is selected from the group of materials consisting essentially of tin oxide, indium oxide, indium tin oxide, zinc oxide, cadmium stannate, and combinations thereof. The second deposition sub-chamber 52b may also include several banks of heaters (not shown) for maintaining the desired substrate temperature.

Upon leaving the transparent conductive oxide deposition Stations 3A and 3B, the web of substrate material 11 passes into Station 4 in which a chamber 56 is adapted to isolate and passivate short circuit defects which are inherently present in the deposited layers of semiconductor alloy material. The chamber 56 includes a tank or vat 58 having conversion reagents 60 contained therein. The chamber 56 also includes a first roller 66 and a second roller 68 adapted to direct the web of substrate material 11 (having the layers of back reflector material, semiconductor alloy material and upper electrode material deposited thereupon) through the conversion reagent bath 60. The chamber 56 further includes a power supply 62 having a counter-electrode 64 associated with one terminal thereof for establishing electrical communication with the layer of TCO atop the web of substrate material 11 by means of one of said rollers (which is formed of electrically conductive material), in this case the first roller 66. As the web of substrate material 11 is continuously advanced through the conversion reagent bath 60, the power supply 62 is activated to provide a bias current through the layers of deposited semiconductor alloy material. Due to the fact that this process has previously been disclosed in detail in commonly assigned U.S. Pat. No. 4,729,970, issued Mar. 8, 1988, the disclosure of which is incorporated herein by reference; it is only necessary to point out that the current from the electrode 64 produces a chemical reaction by which the regions of the transparent conductive oxide immediately surrounding the defects in the semiconductor alloy material are rendered electrically non-conductive and thereby passivated.

It is important to note that there are a wide variety of reagents available for use in passivating short circuit defects in the layers of semiconductor alloy material. In a preferred embodiment, aluminum chloride has been used; however, there are other materials such as those generally known as Lewis acids which will also function in a favorable manner. In addition to aluminum chloride, other members of the group of defect passivators include zinc chloride, tin chloride, titanium chloride, as well as other salts of amphoteric elements.

After isolating and passivating all patent short circuit defects in the deposited layers of semiconductor alloy material, the entire surface of the web of substrate material 11 coated with semiconductor alloy material is electrically operable, i.e., the entire surface can be efficiently employed in photogenerating electric current without incurring a catastrophic failure due to the presence of one or more short circuit, current shunting paths.

The web of substrate material 11 is next advanced to Station 5 (FIG. 2B) at which station a chamber 70 is operatively disposed and adapted to print a grid type pattern 24 onto the exposed surface of the upper electrode of the web of substrate material 11 (said electrode formed from the transparent conductive oxide material 54 deposited at Stations 3A and 3B). While the length and width dimensions of the grid pattern 74 and the number of parallel rows or columns of the grid pattern design may vary without departing from the spirit or scope of the present invention, it is desirable to minimize the number of grid fingers disposed atop the solar cell structure to correspondingly minimize the loss of radiation incident upon the photoactive region thereof. This minimum number of grid fingers must be balanced to ensure that all photogenerated carriers are collected, taking into account the poor lateral conductivity of the amorphous silicon alloy material. Whatever arrangement and spacing is selected, the grid pattern 74 may be affixed to the upper electrode surface by any well known technique, such as screen printing, with any electrically conductive material such as a silver paste. The grid pattern 74, itself, is defined by a plurality of substantially equally spaced, relatively thin, parallel, electrically conductive rays or fingers radiating perpendicularly from both sides of a relatively thick electrically conductive strip 76.

Therefore, upon completing the grid pattern printing operation at Station 5, a plurality of regularly spaced, individual, elongated+electrically conductive strips 76 must be attached to the grid fingers. The strips 76 are formed as elongated, electrically conductive, tin coated copper strips affixed to the surface of the transparent conductive oxide layer by means of an electrically insulating adhesive. Said strips 76 are secured between adjacent rows of grid fingers and electrically connected at only one spot on each set of grid fingers 74. More specifically, the strips 76 are attached by the use of a very thin layer of an electrically insulating silicon adhesive so as to be aligned in such manner as to span across the entire transverse width of the web of substrate material 11, with additional strip material extending beyond each of the distal edges 11a and 11b of said web 11 for interconnection at Station 10, as detailed hereinafter.

After printing the grid pattern 74 at Station 5 and attaching the conductive strips 76 to the exposed surface of the upper electrode of the web of substrate material 11 at Station 6, at least one and preferably two elongated bus bars 78 are spacedly secured along the longitudinal extent of the uncoated side of said web 11. To this end, at Station 7, a negative connection chamber 80 is adapted to receive the continuously moving web of substrate material 11 interiorly thereof and to attach along each longitudinally extending edge thereof an elongated, electrically conductive copper bus bar 78. Each of said bus bars 78 is attached to one of said distal edges 11a and 11b of the web 11 by means of a standard weld point 84 operatively spaced at $\frac{1}{2}$" intervals so as to provide adequate electrical contact to the web 11. The chamber 80 is further adapted to attach a junction box lead 82 to the uncoated side of the web of substrate material 11, said lead being formed as a copper cross-member, extending transversely across part of the width of web 11 and electrically connected to one of the spaced bus bars 78. The said junction box lead 82 is attached directly upon the back surface of the web of substrate material 11 by standard weld points spacedly disposed at $\frac{1}{2}$" intervals. It is at the terminus of the extent of said partial cross-member 82 (said partial cross-member extending only about half-way across the transverse direction of said web) that a space is set aside and designated for the subsequent atachment thereto of the negative lead of an electrical junction box (as illustrated in FIGS. 4C and 4D) which connects said large area, photovoltaic module to another module or to the outside world.

Upon exiting the negative connection chamber 80 at Station 7, the web of substrate material 11 is fed into Station 8 wherein a chamber 84 includes apparatus adapted to attach the first of two electrically conductive cross-members 86. The cross-member attaching chamber 84 is adapted to attach the electrically negative cross-member 86 so as to place said negative cross-member in direct electrical contact with both of said spacedly positioned bus bars 78, said cross-member 86 preferably perpendicularly aligned relative thereto. Said electrically conductive, negative cross-member 86 is fabricated primarily of copper and since it effects the ground connection, need not be maintained in electrical isolation from said web of substrate material 11; therefore, said member 86 may be welded directly to the uncoated surface of said web of substrate material 11. It should be noted at this point that the end-product of the fabrication apparatus described herewith is an elongated, large area, photovoltaic module 102 configured and sized as illustrated in FIG. 4B. The large area module will be approximately four feet long and one foot wide (a generally accepted industrial standard). Therefore, the bus bars 78 will extend approximately the entire four feet length and the negative cross-members 86 must be approximately one foot long in order to electrically interconnect those bus bars. The negative cross-members 86 are spacedly affixed at approximately four foot intervals so that the bus bars 78 will be electrcially interconnected at least once per module.

Having now attached said negative cross-member 86 at Station 8, the web of substrate material 11 enters the taping chamber 88 operatively disposed at Station 9, which chamber 88 is specifically adapted to apply spaced strips of dual sided, electrically insulating, adhesive polyester tape 90. Said taping chamber 88 is adapted to specifically attach a length of said insulating tape 90 directly atop each of said bus bars 78 spacedly positioned along the longitudinal extent of the web. The purpose of applying said tape 90 is to electrically isolate the bus bars 78 from subsequently attached back strips 98 (said back strips 98 adapted to provide electrical contact from the conductive strips 76 to the positive terminal of the module junction box). The taping chamber 88 is further adapted to apply a cross-strip of insulating tape 92, perpendicular to, and in direct physical contact with said longitudinal tape strips 90, said cross-strip 92 operatively arranged parallel to and spaced from said electrically conductive cross member 86. It is the purpose of the perpendicular strip 92 to electrically isolate an electrically conductive, positive cross member 96 (which will subsequently be attached) from the back surface of the grounded, electrically conductive web of substate material 11.

After attachment of said longitudinally extending strips 90 and said perpendicularly extending strips 92, the web of substrate material 11 is advanced into a chamber 94 operatively disposed at Station 10, said chamber 94 designed to fold said conductive strips 76 which extend from the gridded side of the web of substrate material 11 about both of the transverse edges 11a and 11b of said web 11 and into direct physical (and hence electrical) contact with said spacedly disposed, elongated, longitudinally extending adhesive strips 90. In order to accomplish this task, the chamber 94 is equipped with spacedly positioned pressure rollers 95 adapted to firmly press said front conductive strips 76 into contact with the adhesive strips 90, thereby assuring a permanent connection thereto.

Upon completion of the wrap-around process performed in chamber 94 at Station 10, the web of substrate material 11 advances into chamber 97, which is operatively disposed at Station 11 and which is dedicated to the attachment of a pair of distally spaced, elongated, longitudinally extending, electrically conductive backstrips 98 as well as the securement of a positive, transversely extending, electrically conductive cross-member 96. Both the backstrips 98 and the positive cross member 96 are sized and affixed in a substantially identical manner to the size and disposition of the spaced copper bus bars 78 and the ground cross member 86, respectively. More particularly, said backstrips 98 and positive cross-member 96 are electrically conductive and fabricated primarily of copper. Positive connection chamber 97 is specifically adapted to attach said backstrips 98 and said positive cross-member 96 directly atop said insulation strips 90 and 92, respectively, as those strips were previously applied atop bus bars 78 and cross member 86, respectively, in chamber 88 at Station 9. Positive connection chamber 97 is further adapted to press said backstrips 98 and positive cross member 96 tightly onto said adhesive strips 90 and 92, thereby assuring a permanent and effective electrical connection therebetween.

The next step in the continuous process for the fabrication of photovoltaic modules in apparatus 26, takes place at Station 12, at which station the lamination chamber 101 is operatively disposed. Lamination chamber 101 is adapted to form a unified sandwich from the plurality of successively deposited strata which include a layer of insulating material, a layer of adhesive and a protective layer to both a lightweight, readily formable lower laminate 102 (said process described in detail hereinafter) and said photovoltaic device deposited upon said web of a substrate material 11 (described in detail hereinabove). Owing to the many steps required in the performance of the lamination process, a more complete and detailed description of said process will be set forth in the following section, said description referring to the cross-sectional illustration of FIG. 3.

It is to be specifically noted, and as alluded to hereinabove, after completing the lamination process, the photovoltaic device (still in a web-like attitude) is directed into a cutting chamber 104 operatively disposed at Station 13, which station is adapted to perform a blanking operation so as to sever said elongated device-on-a-web into a pre-selected size and configuration. Also, as mentioned previously, due to industrial specifications, the optimal shape of this embodiment is a rectangle defined by the specific dimensions of thirteen inches in width by forty-eight inches in length (13"×48"). The severing apparatus may include one or more conventional components employed in the art of cutting thin sheets of plastic or metal, such as blade-based cutting devices, laser cutting apparatus or even a water jet cutting device. The technique by which photovoltaic material may be severed without shorting the edge portions thereof is described in detail in commonly assigned U.S. Pat. No. 4,704,369, issued Nov. 3, 1987, the disclosure of which is incorporated herein by reference.

After having cut said laminated web of photovoltaic material 11, into discrete 13 inch by 48 inch substantially planar modules, said discrete modules 108 are flipped over and then transferred by a conveyor belt 110 into a final processing chamber 107 operatively disposed at Station 14, said chamber 107 being adapted to form said generally planar, laminated, photovoltaic modules 10 into a pre-selected, three-dimensional configuration. The forming chamber 107 may be a stamping machine, bending machine or a break press. Regardless of nomenclature and operational variances, said forming chamber 107 is adapted to shape said generally planar, large area, laminated sheet of photovoltaic material into a three-dimensional photovoltaic module 100. The 3D module 100 includes a unitary circumferential frame or skirt 122 which provides a sufficient degree of structural rigidity to support said module in operative outdoor disposition, even in the presence of hurricane force winds. This is in stark contrast to previous module designs in which a discrete, expensive, molded frame was provided and said photovoltaic device secured thereto by discrete mechanical fastening means, i.e., nuts and bolts. The details of this forming process will be discussed in detail in the sections which follow.

III. The Lamination Process

Figure 3:
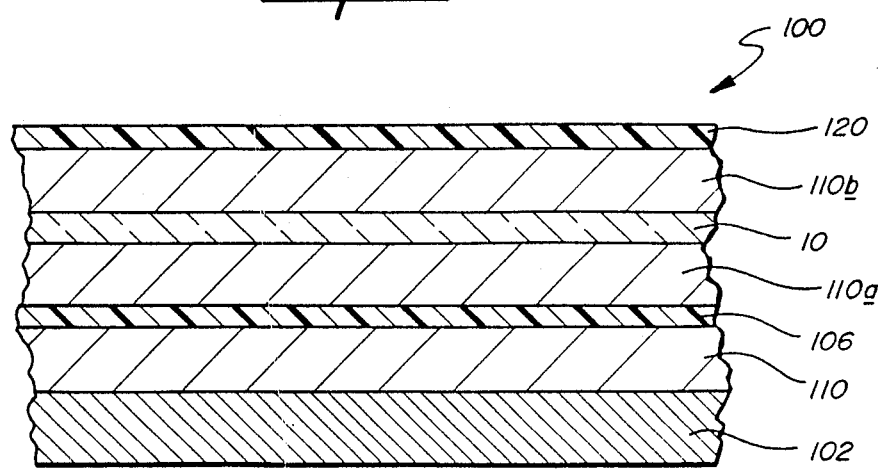
FIG. 3 is a cross-sectional view, partially cut-away and illustrating the layers which combine to integrally form the large area, high current, low voltage photovoltaic module of the subject invention.
Figure 2A:
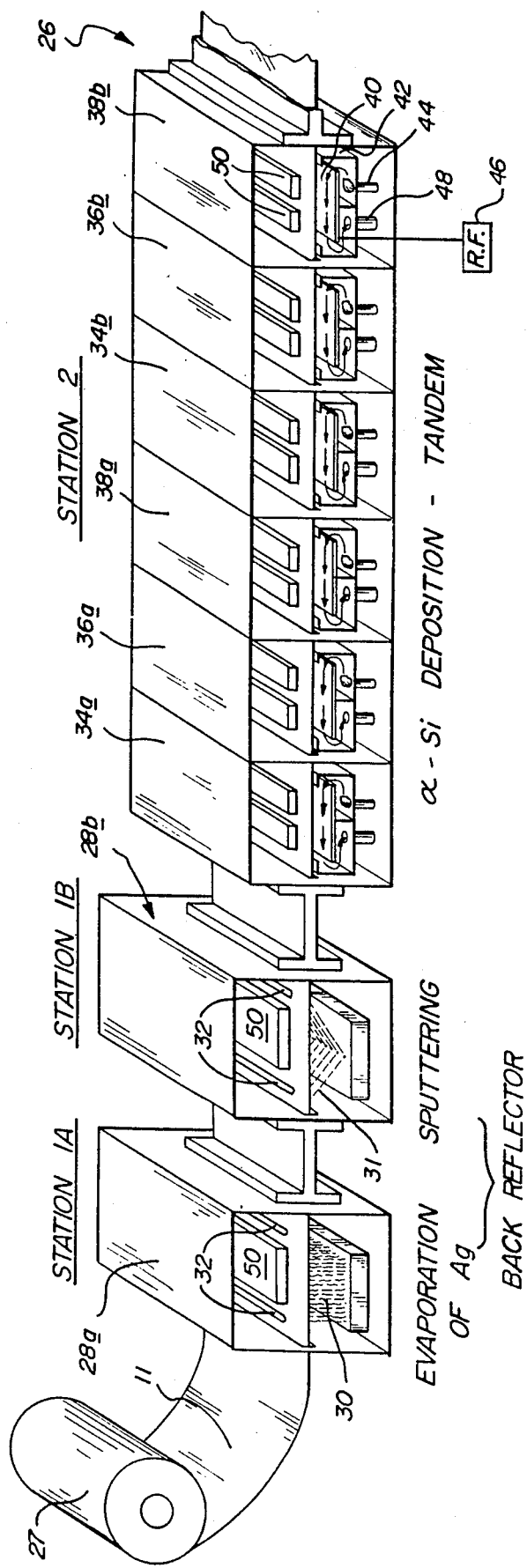
Figure 2A:
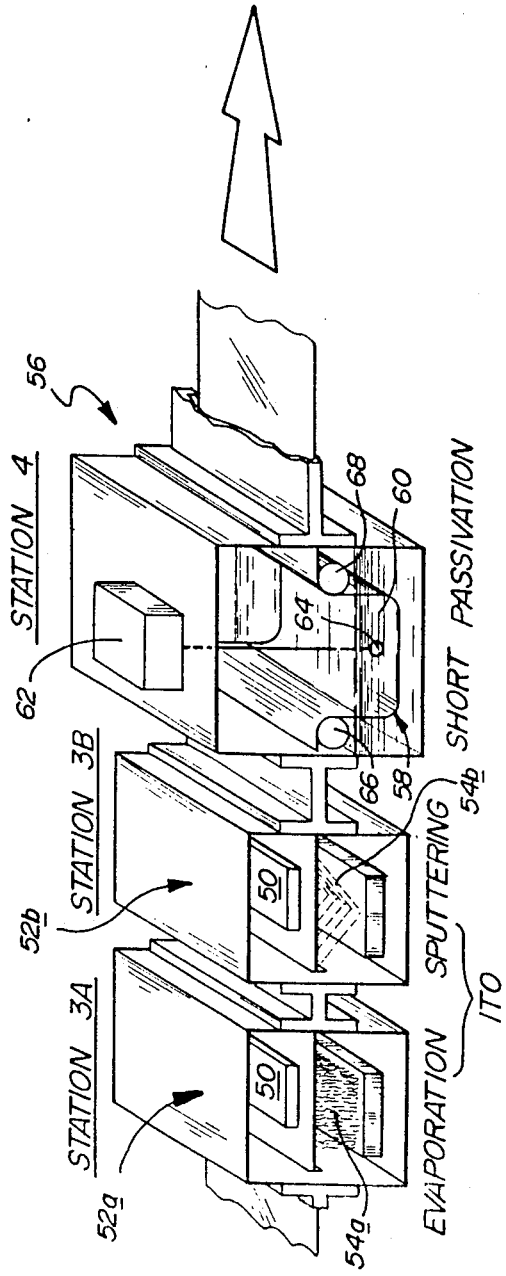
Figure 2B:
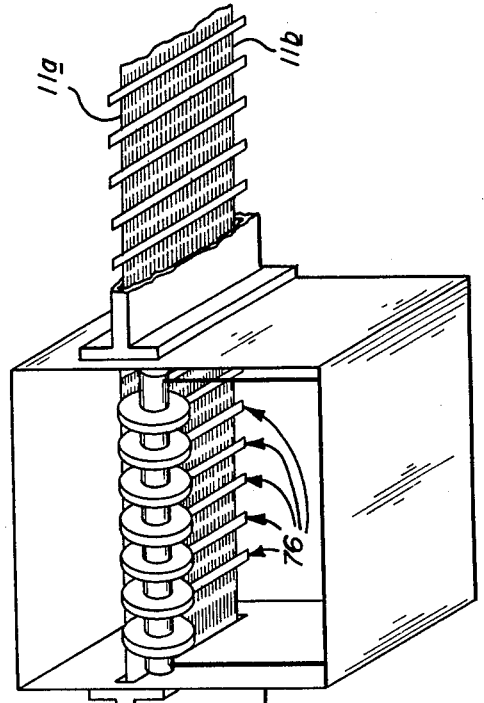
Figure 2B:
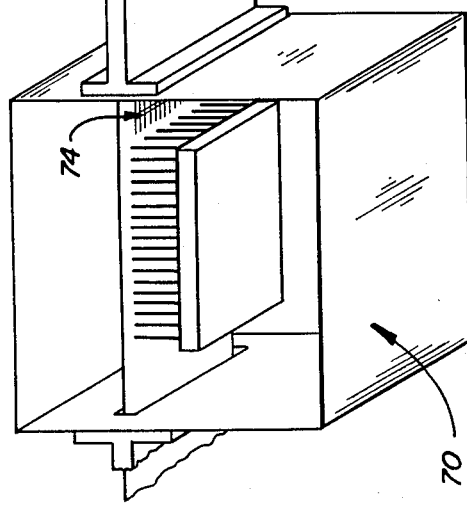
Figure 2B:
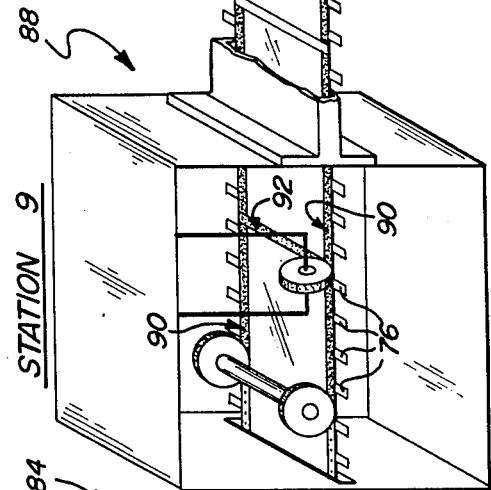
Figure 2B:
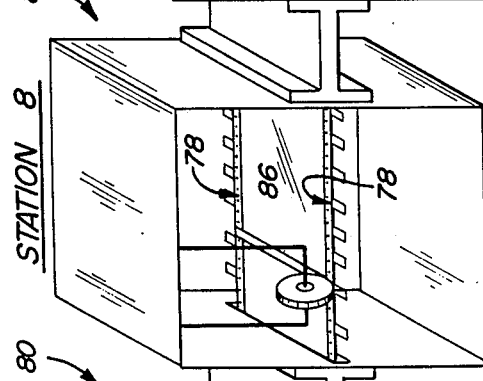
Figure 2B:
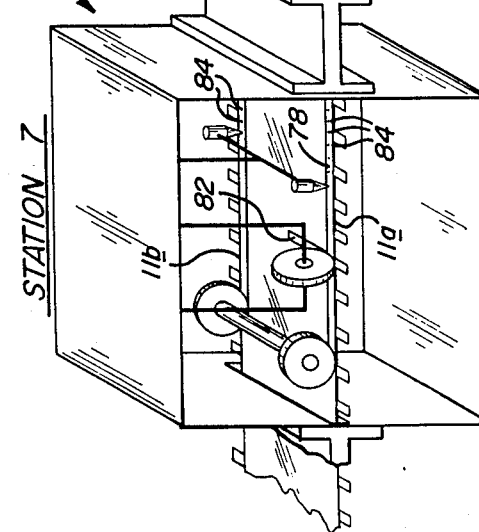

Referring now to FIG. 3, an integrally formed, laminated photovoltaic device, which device includes a photovoltaic cell, such as the cell 10 depicted in FIG. 1, is shown generally by the reference numeral 100. More particularly, FIG. 3 illustrates an n-i-p type photovoltaic device such as the type described hereinabove, said device including (1) a dual-layered back reflector deposited upon one surface of the web of substrate material 11 at Station 1; (2) at least two triads of n-i-p-type layers of semiconductor alloy material deposited atop the back reflector at Station 2; (3) an upper electrode deposited upon the layers of semiconductor alloy material at Station 3; (4) short circuit pathways (shunts) through the semiconductor alloy material, which shunts have been passivated at Station 4; (5) a grid finger pattern printed atop the upper electrode at Station 5; (6) a plurality of electrically conductive strips electrically connected to the grid fingers at Station 6; (7) two spaced bus bars 78 attached to opposed longitudinal edges 11a and 11b of the rear surface of the web of substrate material 11 at Station 7; (8) a ground cross-member 86 affixed between said bus bars at Station 8; (9) insulating tape strips 90 and 92 affixed to the bus bars and ground cross-member 86 at Station 9; (10) the conductive strips 76 wrapped about the opposed longitudinal edges of the web of substrate material 11 and into electrical contact with the insulating edge strips at Station 10; and (11) electrically conductive backstrips 98 placed in electrical communication with the conductive strips 76 and a positive cross-member 96 interconnecting the backstrips 98 at Station 11. The photovoltaic device, so formed, then has a layer of lightweight, durable, readily formable lower laminate material 102 laminated thereonto. As illustrated in and described with respect to FIG. 2, the fabrication of such laminated photovoltaic devices may be readily accomplished in a high throughput, continuous, mass-production type of manufacturing process. As depicted in FIG. 3, the lower laminate 102 may be selected from any lightweight, flexible, readily formable material which is sufficiently durable to withstand environmental conditions and preferably capable of use as an inexpensive, exterior covering for buildings or other construction. While, in a preferred embodiment of this invention, the lower laminate 102 is aluminum, it should be apparent that the use of other lower laminate materials such as galvanized steel or plastic may be employed without departing from the spirit or the scope of the present invention. It is only essential that said lower laminate be capable of withstanding harsh environmental conditions, be formable into a variety of shapes, and be capable of rigidly maintaining the shapes into which it has been formed.

In order to encapsulate the lower laminate 102 to the lower surface of the photovoltaic module 10, an elongated chamber 100 is provided at Station 12 of FIG. 2. Since the purpose of the photovoltaic module is to photogenerate electron-hole pairs, i.e., current, and since the lower laminate may be and preferably is formed of an electrically conductive metallic material, it is necessary to electrically insulate the photovoltaic device 10 from the conductive lower laminate 102 and to electrically insulate the conductive laminate from the environment. This can be accomplished by providing a lower, readily formable, substantially rigid laminate 102 upon the upper surface of which a layer of a dielectric material, for instance a flowable organic resin 110, such as EVA (ethyl vinyl acetate), can be deposited to a uniform thickness of approximately 18 mil. The deposition of the flowable organic resin layer 110 upon the lower laminate 102 may be effected by any number of methods currently known and employed by those skilled in the art; though in the most preferred embodiment, said organic resin is spray coat deposited, with any excess amounts scraped off by a doctor blade or squeegee.

After the deposition of the layer of flowable organic resin 110, an intermediate layer of insulating material 106 may be operatively applied between the photovoltaic device 10 and the organic resin 110 to further electrically insulate the lower laminate 102 from the current photogenerated by the photovoltaic device 10. In the preferred embodiment of the present invention, the intermediate layer of insulating material 106 which is deposited upon the layer of flowable organic resin 110 is TEDLAR (registered Trademark of DuPont Corp.). Since TEDLAR is available in continuous roll form, it may be easily applied by the continuous process shown stylistically in FIG. 2. This intermediate insulating layer 106 has been selected in said rolled format to assume a thickness of approximately 4 mils. Obviously, other dielectric coatings may be sprayed, plasma deposited or dip coated upon said lower laminate without departing from the spirit or scope of the instant invention.

Atop the intermediate layer of insulating material 106, a second layer of flowable organic resin 110a is deposited as by spray application. In the preferred embodiment of this invention, the second layer of flowable organic resin material is also EVA (ethyl vinyl acetate) and said resin is employed as an adhesive to bind the intermediate layer 106 to the lower surface of the photovoltaic device 10 while the previously applied layer of flowable organic resin 110 is also employed as an adhesive to bind the lower laminate 102 to the intermediate layer 106. Note however, that the EVA layers are relatively thickly applied atop the respective laminates and therefore aid in providing said insulative barrier to photogenerated current. More specifically, adhesive layer 110a disposed atop said intermediate layer 106, is uniformly applied to a thickness of approximately 18 mils by a process similar to that described hereinabove, with reference to the flowable organic resin layer 110. Finally, the photovoltaic device 10, which has been described in detail in conjunction with FIG. 1 hereinabove, is placed atop said organic resin.

At this point, the lower laminate material 102 is insulated from the photovoltaic device 10 by said layer of flowable organic resin 110 and an intermediate insulating layer 106, all of said layers being bonded to the photovoltaic device 10 by said adhesive layer 110a of flowable organic resin. In order to complete the encapsulation process, it is then necessary to deposit a layer of flowable organic resin 110b to the upper surface of the photovoltaic device 10. In the preferred embodiment, a layer of EVA (ethyl vinyl acetate) is uniformly, applied, as by spraying, to a thickness of approximately 18 mils by the same process as was employed in the application of flowable organic resin layers 110 and 110a. Finally, a layer of relatively hard, durable, flexible, optically transparent material 120 is deposited upon the uppermost layer of EVA 110b. This uppermost layer 120 is adapted to protect the photovoltaic device 10 from harsh environmental conditions while being transparent to all wavelengths of the incident solar spectrum to which the photovoltaic device 10 is capable of photogenerating charge carriers, i.e., from about 40 to 1000 nanometers. In the preferred embodiment of the present invention, said relatively hard, durable layer 120 is a layer of TEDLAR, of approximately 4 mils thickness. Once again, due to the availability of TEDLAR in continuous roll form, it may be applied by a conventional heat and press technique as described hereinabove. Other relatively hard durable layers which may be employed include those selected from the group consisting essentially of silicon oxides, silicon carbides, silicon nitrides, as well as other organic polymers, all of which may be deposited by any number of sophisticated plasma methods or rudimentary dip and dry processes currently employed by those skilled in the art. The last step of the lamination process involves curing said laminated strata of layers so as to provide an integrated photovoltaic modular structure 100 therefrom.

After completing the lamination process at Station 12, as described in the paragraphs hereinabove, it only remains necessary to form the laminated photovoltaic module 124 into a shape and size suitable for use in a particular application, such as a replacement for exterior siding; as stand-alone modules; as part of a photoelectric power generation installation; or as a backyard installation adapted to photogenerate sufficient quantities of electricity to satisfy household power requirements. In the preferred embodiment of the present invention and as specifically illustrated in FIG. 4A, said laminated modules 100 are cut into planar sheets such that ater the forming operation has been completed, the module measures approximately thirteen inches by forth-eight inches (13"×48"), this size being a generally accepted standard in the industry. The modules 100 are serially transferred into a forming machine 124, such as schematically illustrated as a brake press at Station 14 for bending the peripheral edge portions thereof into a three dimensional, volumetric configuration such a rectangular parallepiped. It should be apparent that, after completion of the forming operation, it is the planar, light incident surface 99 of the photovoltaic module 100 which measures 13"×48". In order to be sure that said module maintains the rectangular, three-dimensional shape, the peripheral edge portions (which edge portions or skirts depend at a 90° angle from the planar face of the module) are riveted (see 132 in FIG. 4B) at the four corners thereof. By utilizing the aluminum lower laminate of the subject invention, the modules so fabricated are lightweight, inexpensive, and rigid.

FIGS. 4A through 4D, depict the details of the module design and fabrication wherein the integrated laminate is altered from a generally planar attitude to assume a three-dimensional module configuration adapted for operative installation. More particularly, FIG. 4A depicts a generally planar, preformed photovoltaic module 100 of generally rectangular shape, which module 100 is adapted to be formed into a three dimensional configuration having a light incident surface measuring approximately 13"×48". The photovoltaic module 100 illustrated in said Figure is sized and shaped as it appears immediately following the removal thereof from cutting Chamber 13 of the continuous processing apparatus of FIG. 2, described hereinabove. Thus, the broken lines 120 represent the lines along which the peripherally extending edge or skirts 122a and 122b of the generally planar, large area module will be folded in order to achieve a desired volumetric configuration. As mentioned hereinabove, that volumetric shape is a rectangular parallelpiped, wherein the peripheral skirts 122a and 122b are bent so as to assume an attitude substantially perpendicular to the planar light incident surface 99 of the module 100, said perpendicular attitude shown in FIG. 4B. It is to be noted that the transversely extending skirts 122b include a lower lip 128 which, when disposed in final form, is bent outwardly so as to provide a surface for affixing said module to a base installation. It is to be noted that said lip may otherwise be bent inward or removed altogether, depending upon the desired method of attachment.

The specific design of one preferred module configuration can be best understood by viewing FIGS. 4C and 4D, wherein there is depicted, respectively, a lateral cross section and a longitudinal cross section of the formed laminated photovoltaic module 100 of FIG. 4B. FIG. 4C illustrates the manner in which the longitudinal peripheral skirts 122a are bent perpendicular to the light incident surface 99 so that said photovoltaic module 100 will assume a generally three dimensional configuration, which configuration will facilitate the use of said photovoltaic module as a building material in the fabrication of new homes or power generation installations. Note that the edge walls 122a are first bent to be generally perpendicular to the light incident surface 99, then the extremities 129a of the skirts 122a are bent to extend inwardly and be generally perpendicular to the skirts 122a and finally the distal ends 131a of each of the extremities 129a are bent to extend upwardly and be generally perpendicular to the extremities 129a.

FIG. 4D is a longitudinal cross section of said photovoltaic module 100 wherein the terminal, peripheral, transverse edges 122b are bent perpendicular to the light incident surface 99 of said module 100 so as to have said module assume said generally three dimensional configuration. In this embodiment, the folds (both longitudinal and transverse) are adapted to lend structural strength to said module (though, as mentioned above, said terminal peripheral edges are additionally adapted to form attachement lips 128b to facilitate the attachment of said modules to supporting structures).

Finally, it is to be noted that affixed to the rear surface of said modules 100 are junction boxes 126, which are adapted to provide a means of electrically interconnecting large area photovoltaic modules 100 with one another or with an external electrical load, such as a grid. Said junction boxes 126 are placed in direct physical and electrical contact with the positive and negative (ground) terminals of said photovoltaic modules 100 by means of a via through the lower laminate 102 and the intervening layers of insulation material, 110, 110a and 106. While not illustrated, it must be appreciated that the junction boxes 126 are additionally equipped with sufficient insulation to prevent electrical communication between the photovoltaic device and the electrically conductive lower laminate material.

The photovoltaic modules 100, thus formed into 3-D configurations, may be consecutively joined so as to assume a physical and electrical series relationship. A framework, the design of which would be within the skill of those of ordinary skill in the art, can be employed to accomplish the aforementioned physical joinder of a plurality of said photovoltaic modules. The number of modules deployed for electrical interconnection depends upon the desired voltage, current and power requirements of the installation. More particularly, each additional module electrically connected in series adds 1.7-2.0 volts of open circuit voltage and over 20 watts (actually over 23 watts) of photovoltaic power generation capability to the installation. By electrically interconnecting 12-13 large area photovoltaic modules in parallel, approximately 15 volts and 20 amperes will be provided so as to deliver approximately 300 watts of photogenerated power. It should be appreciated that all that is required in order to mechanically accomplish said electrical interconnection is to provide a positive lead and a negative lead into the appropriately marked terminals of the junction boxes 126 operatively disposed and readily accessable on the rear surface of the module. It is further to be noted that the photovoltaic modules 100 can also be electrically interconnected in parallel (as well as in combined-series parallel arrangements) so as to satisfy any desired set of current-voltage-power requirements.

Although not readily apparent, the aforedescribed tandem configuration of photovoltaic cells is important to the fabrication process outlines hereinabove. This is because a single photovoltaic cell would require twice the current handling capacity which would make the bus bar fabrication much more difficult and dangerous.

It should be understood that the present invention is not limited to the precise structure illustrated in the afore described embodiments. It is intended rather that the foregoing description of the presently preferred embodiments be regarded as illustrative rather than as a limitation of the present invention. It is therefore following claims, including all equivalents, which define the scope of the instant invention. For instance, while the rectangular configuraton for the photovoltaic module was described and illustrated hereinabove, the formable laminates of the subject invention may be shaped into any given configuration, such as circular or triangular, without departing from the spirit or scope of the invention.

What is claimed is:

1. A method of fabricating a large area, high current, low voltage photovoltaic module, said photovoltaic module including: a common, conductive lower electrode; a photovoltaic body formed by a plurality of superposed, continuous layers of semiconductor alloy material deposited atop the electrode; and a continuous, transparent, electrically conductive, upper electrode deposited atop the photovoltaic body; the method including the sequential or non-sequential steps of:

provinding a common, conductive lower electrode;
depositing the photovoltaic body on said lower electrode;
depositing the transparent conductive upper electrode on said body;
passivating short circuit defects in the semiconductor alloy material from which said body is fabricated; said passivating step operative to alter the stoichiometry of the transparent conductive electrode to a higher electrical resistivity form in the regions proximate said defects;
providing means adapted to collect and transport photogenerated current to positive and negative module terminals;
forming a positive module terminal;
forming a negative module terminal; and
connecting said collection and transporting means to said positive and negative terminals, whereby the large area photovoltaic body is electrically connected so as to photogenerate a high current and low voltage output when exposed to incident radiation.

2. The method of claim 1, including the further step of electrically interconnecting a plurality of photovoltaic modules in series so as to obtain a desired voltage output therefrom.

3. The method of claim 1, wherein the step of providing the photovoltaic body with current collection and transporting means comprises printing a grid pattern of silver paste upon the transparent conductive upper electrode; and including the further steps of:

electrically connecting said grid pattern to at least one of a plurality of substantially regularly spaced, electrically conductive strips; and
electrically connecting said strips to the positive terminal.

4. The method of claim 3, including the further steps of:

affixing at least one elongated bus bar along the longitudinal length of and in electrical communication with said common lower electrode; and
electrically connecting said bus bar to said negative terminal.

5. The method of claim 4, wherein the step of electrically connecting said strips to the positive terminal comprises wrapping said strips about at least one of the edges of the lower electrode and into electrical communication with at least one electrically conductive, elongated backstrip.

6. The method of claim 5, including the further steps of: forming the electrically conductive strips of tin coated copper; and securing said strips between alternate rows of said current collecting grid pattern by means of an electrically insulating adhesive, said adhesive disposed upon one side of the strips.

7. The method of claim 5, wherein the step of affixing the at least one bus bar includes the further steps of: providing two bus bars; and welding each bus bar along one of the opposed longitudinal edges of said lower electrode.

8. The method of claim 7, including the further step of providing two elongated backstrips, each backstrip insulated from and affixed to one of said bus bars.

9. The method of claim 8, including the further step of utilizing copper backstrips and busbars.

10. The method of claim 9, wherein the step of wrapping said conductive strips includes the further step of providing elongated strips so that the opposed distal ends thereof may be wrapped about both of the respective edges of the common lower electrode and electrically connected to the backstrips operatively disposed adjacent the longitudinal edges of said lower electrode.

11. The method of claim 8, including the further steps of: providing at least one copper positive cross-member; electrically isolating said cross-member from said lower electrode; and electrically connecting said cross-member to the spacedly disposed, elongated backstrips.

12. The method of claim 8, including the further step of electrically isolating said elongated backstrips from said elongated bus bars by covering said bus bars with an electrically insulating, double-sided adhesive tape and affixing said backstrips thereto.

13. The method of claim 7, including the further steps of providing at least one copper negative cross-member and electrically connecting said negative cross-member to the spacedly disposed, elongated bus bars.

14. The method of claim 5, including the further step of soldering said conductive strips to said backstrips to insure permanence of the electrical connection therebetween.

15. The method of claim 1, wherein the common lower electrode is selected from the group consisting essentially of an electrically conductive metal, and an insulating material having a highly electrically conductive coating deposited thereupon.

16. The method of claim 1, wherein the step of depositing the photovoltaic body comprises successively depositing at least two triads of n-i-p layers of silicon alloy material.

17. The method of claim 1, including the futher step of forming said transparent conductive upper electrode from a material selected from the group consisting essentially of indium tin oxide, tin oxide, indium oxide, zinc oxide, cadmium stannate, and combinations thereof.

18. The method of claim 1, wherein the step of passivating short circuit defects comprises the further steps of:

contacting the transparent conductive upper electrode with a reagent capable of converting the upper electrode into a higher electrical resistance state; and
activating said conversion reagent so as to convert said transparent conductive upper electrode to said higher resistance state only adjacent defect regions.

19. The method of claim 18, wherein the conversion reagent is selected from the group consisting essentially of a Lewis acid and the salt of an amphoteric element.

20. The method of claim 18, wherein the step of activating said conversion reagent comprises passing an electrical current through said defect regions.

21. The method of claim 18, wherein the step of activating said conversion reagent comprises the heating or illumination of said defect regions.

22. The method of claim 1, including the further steps of shaping of the photovoltaic module as a rectangle, said rectangle described by the dimensions of approximately 13"×48'.

23. The method of claim 22, wherein the voltage output of said photovoltaic module is about 1.7–2.0 volts and the current output of said module is about 21 amperes.

24. A large area, high current, low voltage photovoltaic module including:
a common, conductive lower electrode;
a photovoltaic body formed by a plurality of superposed, continuous layers of semiconductor alloy material deposited atop said electrode;
a continuous transparent, electrically conductive, upper electrode deposited atop said photovoltaic body;
the stoichiometry of the transparent conductive electrode altered to a higher resistivity form in those regions proximate defects in the photovoltaic body;
means adapted to collect and transport photogenerated current to positive and negative module terminals;
a positive module terminal electrically connected to said transparent conductive upper electrode; and
a negative module terminal electrically connected to the common lower electrode.

25. A photovoltaic module as in claim 24, wherein a plurality of photovoltaic modules are electrically connected in series so as to obtain a desired voltage output therefrom.

26. A photovoltaic device in claim 25, wherein each of said photovoltaic modules is preferably rectangular in shape.

27. A photovoltaic module as in claim 25, wherein each of said photovoltaic modules is substantially rectangular in shape and described by the dimensions of approximately 13"×48".

28. A photovoltaic module as in claim 27, wherein the voltage output of each of said modules is approximately 1.2–2.0 volts and the current output of each of said modules is approximately 21 amperes.

29. A photovoltaic module as in claim 28, wherein the voltage output of two of said modules electrically connected in series is approximately 2.4–4.0 volts and the current output of two of said modules electrically connected in series is approximately 21 amperes.

30. A photovoltaic module as in claim 24, wherein a connection to said negative terminal is provided by two electrically conductive, elongated busbars, each busbar welded along one of the opposed longitudinal edges of said lower electrode.

31. A photovoltaic module as in claim 30, wherein a plurality of electrically conductive, spacedly disposed strips electrically interconnect said current collecting and transporting means.

32. A photovoltaic module as in claim 31, wherein said conductive strips are electrically connected to two electrically conductive, elongated backstrips, each backstrip insulated from and affixed to one of said busbars.

33. A photovoltaic module as in claim 32, wherein said backstrips and bus bars are fabricated of copper.

34. A photovoltaic module as in claim 32, wherein said backstrips are electrically insulated from said busbars by means of an electrically insulating, double-sided adhesive tape.

35. A photovoltaic module as in claim 32, wherein said backstrips are electrically interconnected by at least one copper, positive cross-member, said backstrips electrically insulated from said lower electrode and affixed to the opposed backstrips.

36. A photovoltaic module as in claim 30, wherein said spacedly disposed busbars are electrically interconnected by at least one copper, negative cross-member.

37. A photovoltaic module as in claim 24, wherein said common lower electrode is formed from a material selected from the group consisting of an electrically conductive metal, and an insulating material having a highly electrically conductive coating thereupon.

38. A photovoltaic module as in claim 24, wherein said plurality of layers of semiconductor alloy material includes at least two triads of n-i-p layers of amorphous silicon alloy material.

39. A photovoltaic module as in claim 24, wherein said transparent conductive upper electrode is selected from the group consisting of indium oxide, tin oxide, indium tin oxide, zinc oxide, cadmium stannate, and combinations thereof.

* * * * *